US009434135B2

(12) United States Patent
Erie et al.

(10) Patent No.: US 9,434,135 B2
(45) Date of Patent: *Sep. 6, 2016

(54) PANEL WITH RELEASABLE CORE

(71) Applicant: Intel Corporation, Santa Clara, CA (US)

(72) Inventors: Jean-Marie Erie, Chandler, AZ (US); Ravi Shankar, Chandler, AZ (US); Ching-Ping Janet Shen, Gilbert, AZ (US); Rose Mulligan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 52 days.

This patent is subject to a terminal disclaimer.

(21) Appl. No.: 14/227,750

(22) Filed: Mar. 27, 2014

(65) Prior Publication Data
US 2015/0174859 A1 Jun. 25, 2015

Related U.S. Application Data

(63) Continuation-in-part of application No. 14/135,168, filed on Dec. 19, 2013.

(51) Int. Cl.
B32B 7/12 (2006.01)
B32B 15/20 (2006.01)
H01L 21/683 (2006.01)
(Continued)

(52) U.S. Cl.
CPC .............. B32B 15/20 (2013.01); B32B 7/12 (2013.01); B32B 15/092 (2013.01); B32B 27/20 (2013.01); H01L 21/6836 (2013.01); B32B 2250/40 (2013.01); B32B 2264/107 (2013.01); B32B 2307/202 (2013.01); B32B 2457/14 (2013.01); Y10T 156/10 (2015.01); Y10T 428/2495 (2015.01); Y10T 428/24752 (2015.01); Y10T 428/24975 (2015.01); Y10T 428/30 (2015.01); Y10T 428/31678 (2015.04)

(58) Field of Classification Search
CPC ........ B32B 15/043; B32B 7/12; B32B 9/041
See application file for complete search history.

(56) References Cited

U.S. PATENT DOCUMENTS 5,063,658 A 11/1991 Wild
5,306,670 A 4/1994 Mowatt et al.
5,806,177 A 9/1998 Hosomi et al.
(Continued)

OTHER PUBLICATIONS

"U.S. Appl. No. 14/135,168, Restriction Requirement mailed Jul. 28, 2015", 7 pgs.
(Continued)

Primary Examiner — Victor Chang
(74) Attorney, Agent, or Firm — Schwegman Lundberg & Woessner, P.A.

(57) ABSTRACT

Generally discussed herein are systems and apparatuses that can include a releasable core panel. The disclosure also includes techniques of making and using the systems and apparatuses. According to an example a technique of making a releasable core panel can include (1) arranging a mask on a center portion of the panel, the panel including a center stiffener with a first foil attached to a first side of the center stiffener by a first adhesive layer and a second foil attached to a second side of the center stiffener by a second adhesive layer, the first side of the center stiffener opposite the second side of the center stiffener, (2) removing portions of exposed edges of the panel, and (3) removing the mask.

9 Claims, 10 Drawing Sheets

(51) Int. Cl.
B32B 15/092 (2006.01)
B32B 27/20 (2006.01)

(56) References Cited

U.S. PATENT DOCUMENTS

| | | | |
|---|---|---|---|
| 6,175,084 | B1 | 1/2001 | Saitoh et al. |
| 6,523,734 | B1 | 2/2003 | Kawai et al. |
| 6,663,980 | B1 | 12/2003 | Saijo et al. |
| 7,222,421 | B2 | 5/2007 | Nakamura |
| 9,161,452 | B2 | 10/2015 | Huang |
| 2005/0082669 | A1 | 4/2005 | Saijo et al. |
| 2007/0095471 | A1 | 5/2007 | Ito et al. |
| 2007/0124924 | A1 | 6/2007 | Nakamura |
| 2007/0277909 | A1 | 12/2007 | Tsukahara et al. |
| 2008/0053686 | A1 | 3/2008 | Ishii et al. |
| 2008/0054448 | A1 | 3/2008 | Lu et al. |
| 2008/0202661 | A1 | 8/2008 | Kobayashi |
| 2009/0025217 | A1 | 1/2009 | Kamei |
| 2011/0154657 | A1 | 6/2011 | Chuang et al. |
| 2011/0155443 | A1 | 6/2011 | Maeda et al. |
| 2013/0143062 | A1 | 6/2013 | Kaneko et al. |
| 2014/0078706 | A1 | 3/2014 | Hu et al. |
| 2014/0090879 | A1 | 4/2014 | Seneviratne et al. |
| 2014/0177193 | A1 | 6/2014 | Jin et al. |
| 2014/0300009 | A1 | 10/2014 | Hsu |
| 2014/0305683 | A1 | 10/2014 | Li |
| 2014/0367155 | A1 | 12/2014 | Huang |
| 2015/0008566 | A1 | 1/2015 | Gerber et al. |
| 2015/0111000 | A1 | 4/2015 | Sasaki |
| 2015/0174858 | A1 | 6/2015 | Shankar et al. |
| 2015/0181713 | A1 | 6/2015 | Shen et al. |
| 2015/0181717 | A1 | 6/2015 | Shen et al. |
| 2016/0035661 | A1 | 2/2016 | Suzuki |

OTHER PUBLICATIONS

Chiu, H. T, et al., "Study on mechanical properties and intermolecular interaction of silicone rubber/polyurethane/epoxy blends", Journal of Applied Polymer Science, 89(4), (Jul. 25, 2003), 959-970.

Hou, S. S, et al., "Function and performance of silicone copolymer. Part IV. Curing behavior and characterization of epoxy—siloxane copolymers blended with diglycidyl ether of bisphenol-A", Polymer, 41(9), (Apr. 2000), 3263-3272.

"U.S. Appl. No. 14/135,168, Interview Summary mailed Aug. 26, 2015", 2 pgs.

"U.S. Appl. No. 14/135,168, Response filed Aug. 11, 2015 to Restriction Requirement mailed Jul. 28, 2015", 8 pgs.

"U.S. Appl. No. 14/135,168, Response filed Oct. 20, 2015 to Restriction Requirement mailed Aug. 31, 2015", 9 pgs.

"U.S. Appl. No. 14/135,168, Restriction Requirement mailed Aug. 31, 2015", 6 pgs.

U.S. Appl. No. 14/135,168, Examiner Interview Summary mailed Mar. 2, 2016, 3 pgs.

U.S. Appl. No. 14/135,168, Final Office Action mailed Apr. 25, 2016, 7 pgs.

U.S. Appl. No. 14/135,168, Response filed Mar. 25, 2016 to Non Final Office Action mailed Feb. 2, 2016, 5 pgs.

U.S. Appl. No. 14/227,697, Non Final Office Action mailed May 9, 2016, 20 pgs.

U.S. Appl. No. 14/227,723, Non Final Office Action mailed May 20, 2016, 26 pgs.

PANEL WITH RELEASABLE CORE

RELATED APPLICATION

This application claims priority to U.S. patent application Ser. No. 14/135,168 with filing date Dec. 19, 2013, which is incorporated herein by reference in its entirety.

TECHNICAL FIELD

Examples generally relate to panel architectures and methods.

TECHNICAL BACKGROUND

Substrate manufacturing technology can include the use of panels to help increase the number of dies that can be manufactured at a given time. Substrate manufacturing can be inefficient, wasteful, or cost prohibitive. Such problems can be prevalent when building substrates using one or more panels.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate generally to substrates or panels, such as panels that can include coreless or cored substrates built thereon, and techniques of making and using the same. Examples also relate to systems that can include one or more of the substrates or panels.

Figure 1:
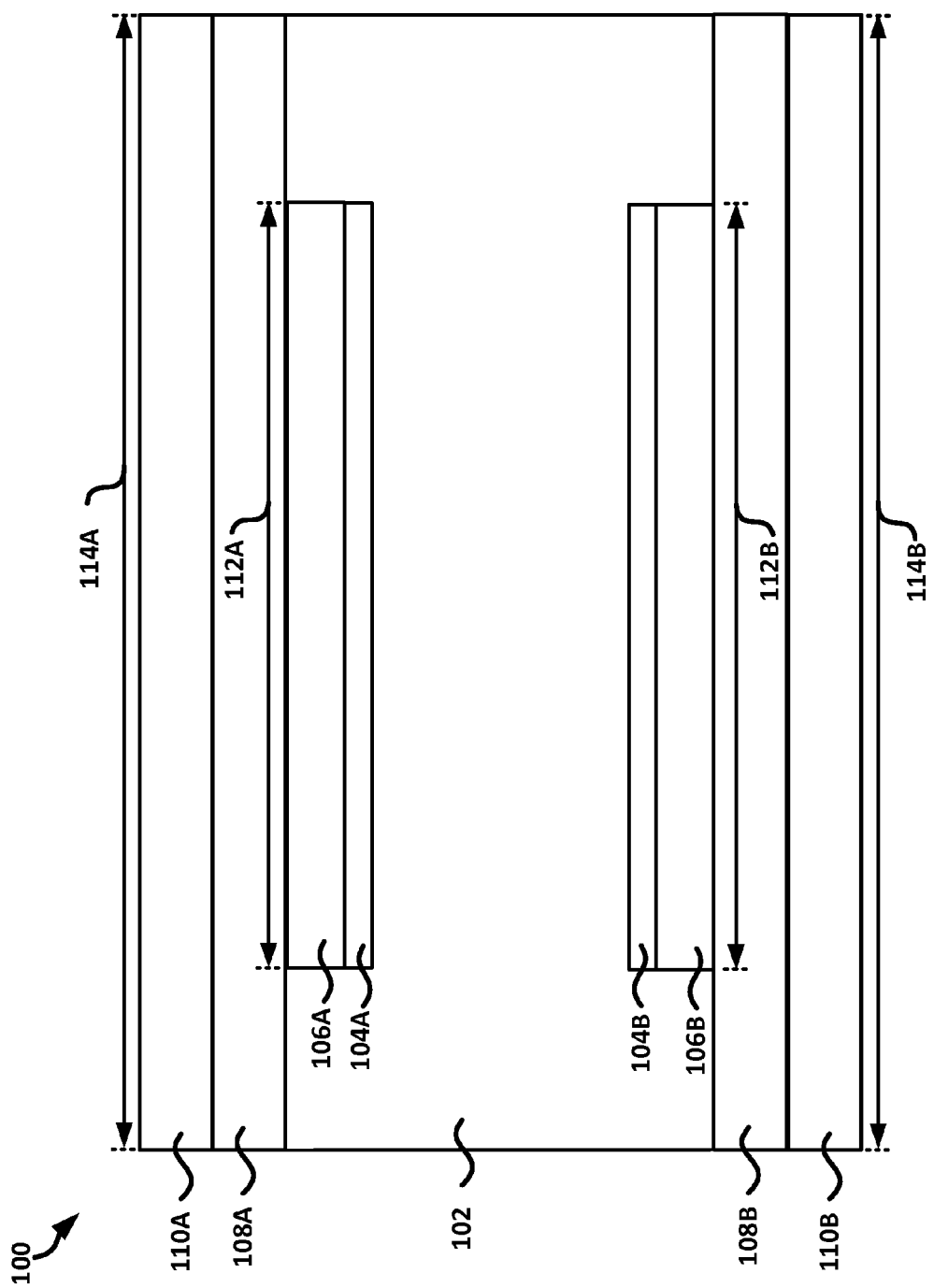
FIG. 1 shows an example of a core panel architecture.

FIG. 1 shows an example of a core panel 100. The panel 100 can include a base 102, an inner foil 104A or 104B, an outer conductive foil 106A or 106B, or a resin 108A or 108B coating on an outermost conductive foil 110A or 110B. The inner foil 104A-B and the outer conductive foil 106A can include a width 112A or 112B that is less than a width 114A or 114B of the outermost conductive foil 110A-B and the base 102. The resin 108A-B and the outermost conductive foil 110A can comprise a resin coated conductive layer. The resin coated conductive layer (i.e. 108A and 110A or 108B and 110B) can be pressed into the outer conductive foil 106A-B so as to form a temporary bond or seal between the resin 108A-B and the outer conductive foil 106A-B.

The base 102 can begin as a substantially rectangular structure and be processed to be generally "H" shaped, such as by forming a recess in each side of the base 102.

A substrate can be built on the outermost conductive foil 110A-B. The resin coated conductive layer can be removed from the base 102 and the outer conductive foil 106A, such as with the substrate thereon (substrate not shown in FIG. 1). The resin coated conductive layer can be removed from the substrate such as by etching, wet blasting, or a combination thereof.

The panel 100 can cost about $75 per panel from a manufacturer. Arranging the inner foil 104A-B and the outer conductive foil 106A-B within a recess in the base 102 (such as shown in FIG. 1) can increase the cost of the panel 100. The increase in cost can be due, at least in part, to extra processing that is required to arrange the inner foil 104A-B and the outer conductive foil 106A-B in a recess of the base 102. The increase in cost can be due, at least in part, to processing conductive foil panels to be the width 112A-B, and inserting the modified foil panels into the recess in the base 102.

Figure 2:
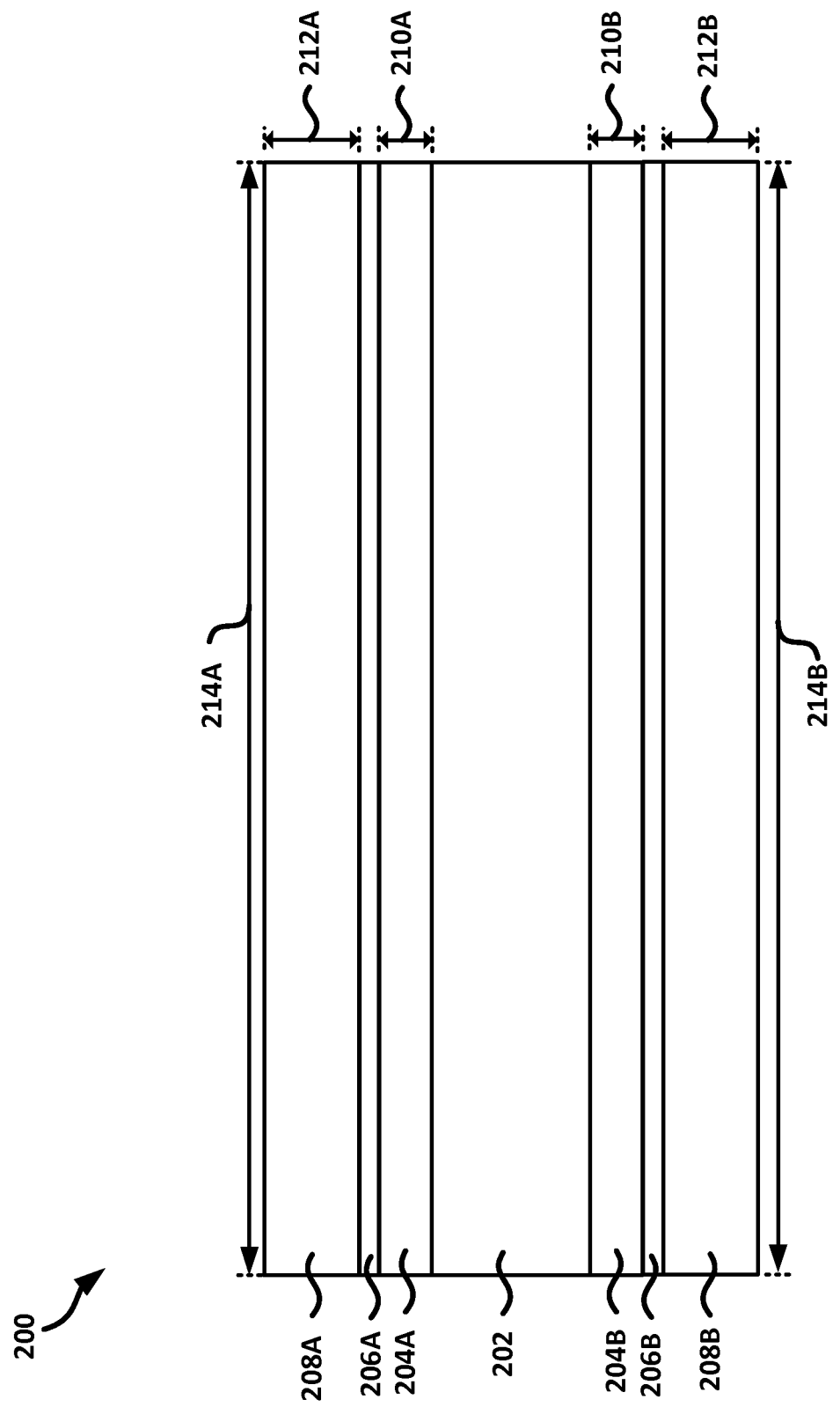
FIG. 2 shows an example of another panel architecture.

FIG. 2 shows an example of a core panel 200 according to one or more embodiments. The core panel 200 can include a base 202, an inner foil 204A or 204B, an adhesive layer 206A or 206B, or an outer conductive foil 208A or 208B. The inner foil 204A-B can include a thickness 210A or 210B that is less than a thickness 212A or 212B of the outer conductive foil 208A-B (i.e. the outer conductive foil 208A-B can be thicker than the inner foil 204A-B).

The inner foil 204A-B and the outer conductive foil 208A-B can be substantially the same width 214A or 214B as the base 202. The inner foil 204A-B or the outer conductive foil 208A-B can be substantially flush with the base 202, such as shown in FIG. 2. By including inner foil 204A-B and outer conductive foil 208A-B that are substantially the same width as (e.g., flush with) the base 202, processing required to make the panel 200 can be simpler or cheaper than the processing required to make the panel 100. The processing can be simpler in that the inner foil 204A-B and the outer conductive foil 208A-B need not be processed to fit in a recess of the base 202, which the panel 100 can include. Also, the base 202 does not need to be processed to include a recess in which the inner foil 204A-B or the outer conductive foil 208A-B can be arranged in. By removing a processing step, the cost of manufacturing the panel 200 can be reduced. In addition, the resin coated conductive layer (i.e. the outermost conductive foil 110A-B and the resin 108A-B) is not present in the panel 200, thus reducing the material needed to make the panel 200 and decreasing the cost of manufacturing the panel 200, such as relative to the panel 100.

Arranging the adhesive layer 206A-B between the inner foil 204A-B and the outer conductive foil 208A-B can allow the outer conductive foil 208A-B to be peeled away from the inner foil 204A-B. However, when the inner foil 204A-B is thinner than the outer conductive foil 208A-B, a yield loss of subsequent packages manufactured on the panel may be significant. A number of unwanted failure modes may be present. For example, the inner foil 204A-B can be damaged or the outer conductive foil 208A-B can be prematurely released from the inner foil 204A-B during manufacturing, such as adding a substrate on the top or bottom of the panel 200, such as at an outer surface of the outer conductive foil 208A-B.

Figure 3:
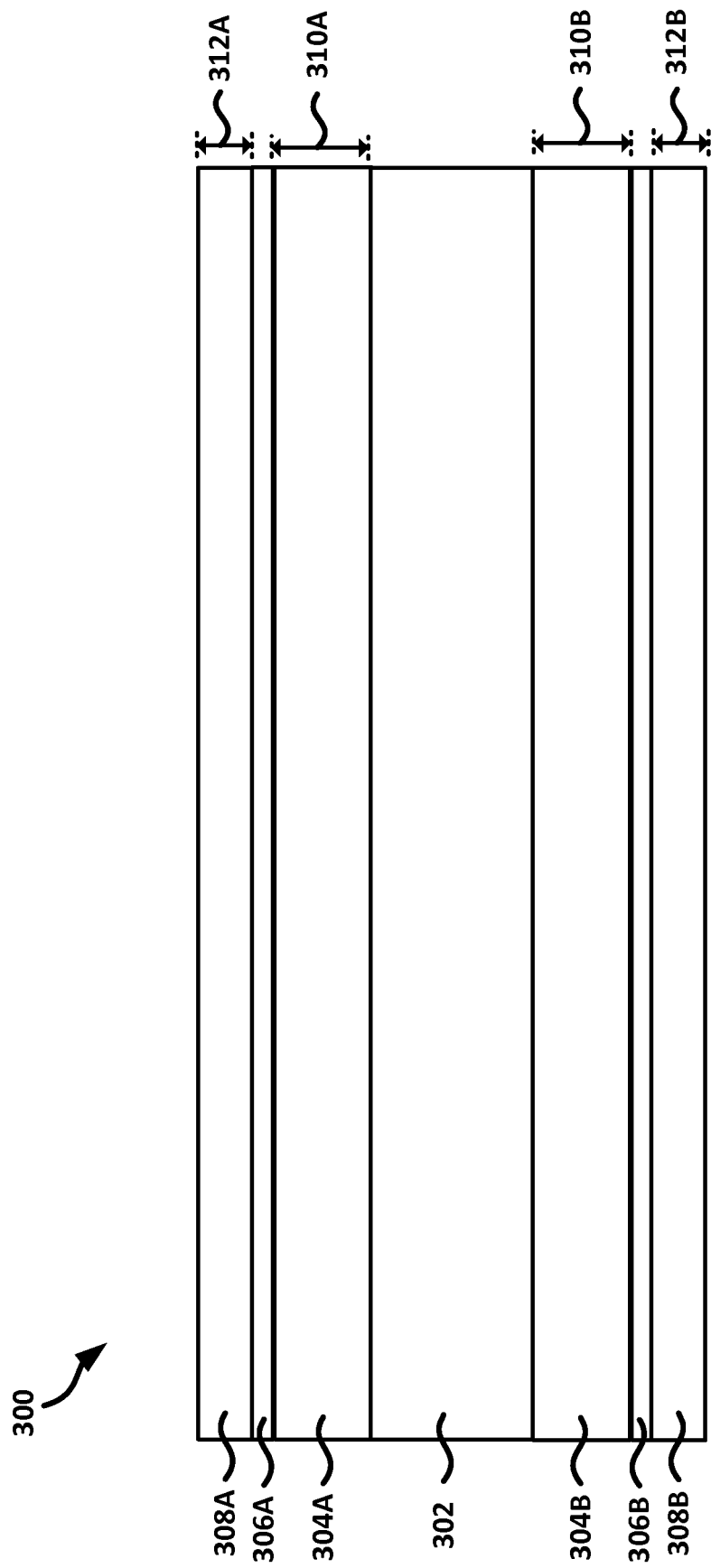
FIG. 3 shows an example of yet another panel architecture.

FIG. 3 shows an example of a core panel 300 according to one or more embodiments. The core panel 300 can be substantially similar to the core panel 200 with the inner foil 304A-B including a thickness 310A-B that is greater than the thickness 312A-B of the outer conductive foil 308A-B, whereas the core panel 200 includes an inner foil 204A-B with a thickness 210A-B that is less than the thickness 212A-B of the outer conductive foil 208A-B. Note that while the outer conductive foil 308A-B is shown as releasably coupled to the inner foil 304A-B, the outer conductive foil can be releasably coupled to the base 302, such as by situating the adhesive later 306A-B on the base 302 and coupling the outer conductive foil 308A-B to the base.

The core panel 300 can be received at a Substrate Packaging Technology Development (SPTD) factory and used for manufacturing a substrate thereon. The core panel 300 can include a base 302, an inner foil 304A or 304B, an adhesive layer 306A or 306B, or an outer conductive foil 308A or 308B.

The base 302 can include a material that is rigid enough to withstand processing at the SPTD factory and retain shape. In one or more embodiments, the base 302 can include a material impregnated with a polymer. In one or more embodiments, the base 302 can include a carbon material impregnated with an epoxy or resin. In one or more embodiments, the base 302 can include a metal, plastic, or other substantially rigid material. The base 302 can be generally rectangular and generally flat.

The inner foil 304A-B can be affixed to the base 302. The inner foil 304A-B can include a conductive material such as copper, gold, silver, aluminum, a combination thereof, or other conductive material. In one or more embodiments the inner foil 304A-B can include a thickness 310A of between about 10 and 40 micrometers. In one or more embodiments, the inner foil 304A-B can include a thickness 310A-B of between about 15 and 20 micrometers. In one or more embodiments, the inner foil 304A-B can include a thickness 310A-B of about 18 micrometers.

The adhesive layer 306A-B can releasably couple the outer conductive foil 308A-B to the inner foil 304A-B. The adhesive layer 306A-B can include an epoxy, resin, a combination thereof, or other material. The adhesive layer 306A-B can be pressed (e.g., hot pressed, baked with pressure, or laminated) into the inner foil 304A-B. Such pressing can form a releasable coupling between the inner foil 304A-B and the outer conductive foil 308A-B, such as shown in FIG. 3. The base 302 and the outer conductive foil 308A-B can be releasably uncoupled, such as by mechanically removing (e.g., pulling) the outer conductive foil 308A-B away from the inner foil 304A-B. The outer conductive foil 308A-B can be removed from the inner foil 304A-B after a substrate has been manufactured on the panel 300 (see FIG. 6).

The adhesive layer 306A-B can include a methyl ethyl ketone and toluene solvent with polydimethyl siloxane and bisphenol A based epoxy. An adhesive layer 306A-B made from these materials can suffer from phase separation between the epoxy and silicone over time. Heat can cause blisters to form in the adhesive layer 306A-B made from these materials. The adhesive strength of such adhesive layer 306A-B can degrade over time. An adhesive layer made of these materials can have poor line yields, such as in a SPTD factory.

As used herein releasably coupling means to couple such that a mechanical coupling through the adhesive layer 306A-B can be broken without requiring excessive force or damaging the items mechanically coupled through the adhesive layer 306A-B. The adhesive layer 306A-B can be released from an item by exerting a relatively small amount of force, such as about five Newtons per meter to about one hundred Newtons per meter on or near the adhesive layer 306A-B.

The adhesive layer 306A-B can include one or more epoxy silicone copolymers or blends of polymers, silicone, or epoxy. Different blends can be used to make adhesive layer 306A-B with varying mechanical properties, such as depending on the volume weight percent of polymer, silicone, or epoxy used. The mechanical properties can include hardness, elasticity, stickiness, or other mechanical property.

The adhesive layer 306A-B can include an epoxy and silicone blend. For example, siloxane and epoxy resin can be blended together with a carboxylic acid anhydride hardener, such as to produce a stable or well-blended adhesive layer 306A-B. This blend can be used as an adhesive by controlling the siloxane to epoxy resin ratio. By increasing the proportion of siloxane, an adhesive layer 306A-B with a reduced elastic modulus can be produced.

The adhesive layer 306A-B can include a blend of co-polymer, epoxy, or silicone. A co-polymer of siloxane and epoxy can be produced and mixed with an epoxy resin. Polysiloxane can have an epoxide group on a side chain thereof and can be synthesized from methylhydrosiloxane, epoxy resin.

The outer conductive foil 308A-B can be coupled to the inner foil 304A-B using the adhesive layer 306A-B. The outer conductive foil 308A-B can include a conductive material such as copper, gold, silver, aluminum, a combination thereof, or other conductive material. The outer conductive foil 308A-B can include a thickness 312A-B that is smaller than a thickness 310A-B of the inner foil 304A-B.

A yield loss realized in manufacturing a substrate onto the outer conductive foil 308A-B can be reduced by including an outer conductive foil 308A-B with a thickness 312A-B that is smaller than the thickness 310A-B of the inner foil 304A-B. In one or more embodiments, the thickness 312A-B of the outer conductive foil 308A-B can be between about one and thirty micrometers. In one or more embodiments, the thickness 312A-B of the outer conductive foil 308A-B can be between about two and fifteen micrometers. In one or more embodiments, the thickness 312A-B of the outer conductive foil 308A-B can be between about two and six micrometers. In one or more embodiments, the thickness 312A-B of the outer conductive foil 308A-B can be between about three and five micrometers. In one or more embodiments, the thickness 312A-B of the outer conductive foil 308A-B can be about five micrometers.

As the thickness 312A-B of the outer conductive foil is increased, the yield loss realized in manufacturing a substrate on the outer conductive foil 308A-B can be decreased. However, if the thickness of the outer conductive foil is too large, delamination of the outer conductive foil 308A-B can increase yield loss. In an embodiment that includes an outer conductive foil 308A-B with a thickness 312A-B that is less than five micrometers, the outer conductive foil 308A-B may not be reliably releasable from the inner foil 304A-B. The outer conductive foil 308A-B can break in the separation process, or some residue from the outer conductive foil 308A-B or the adhesive layer 306A-B can be left on the inner foil 304A-B in the process of separating the outer conductive foil 308A-B from the inner foil 304A-B.

Figure 4:
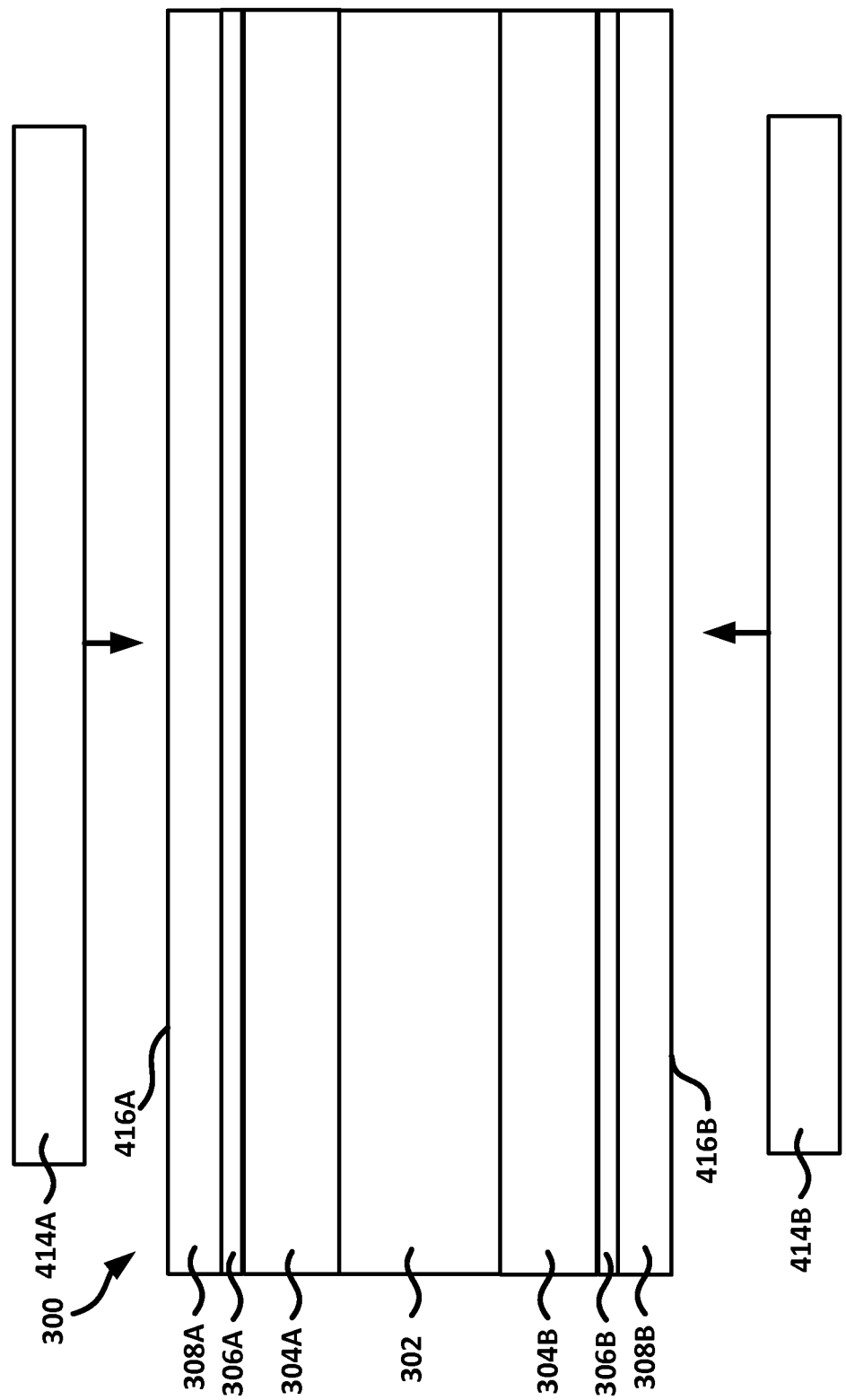
FIG. 4 shows the example panel of FIG. 3 with a mask being arranged on the panel.

FIG. 4 shows the core panel 300 of FIG. 3 with a mask 414A or 414B being arranged on a surface 416A or 416B of the outer conductive foil 308A-B. The mask 414A-B can include an Ultra Violet (UV) adhesive, a Dry Film Resist (DFR), a solder resist, or other material sufficient to protect material underneath the mask 414A-B from a removal process, such as an etch process, (e.g., a positive etch material). Although a positive etch mask I shown, one of ordinary skill in the art, having he benefit of the present disclosure, will recognize that a negative masking arrangement is also within the scope of the disclosure.

Figure 5:
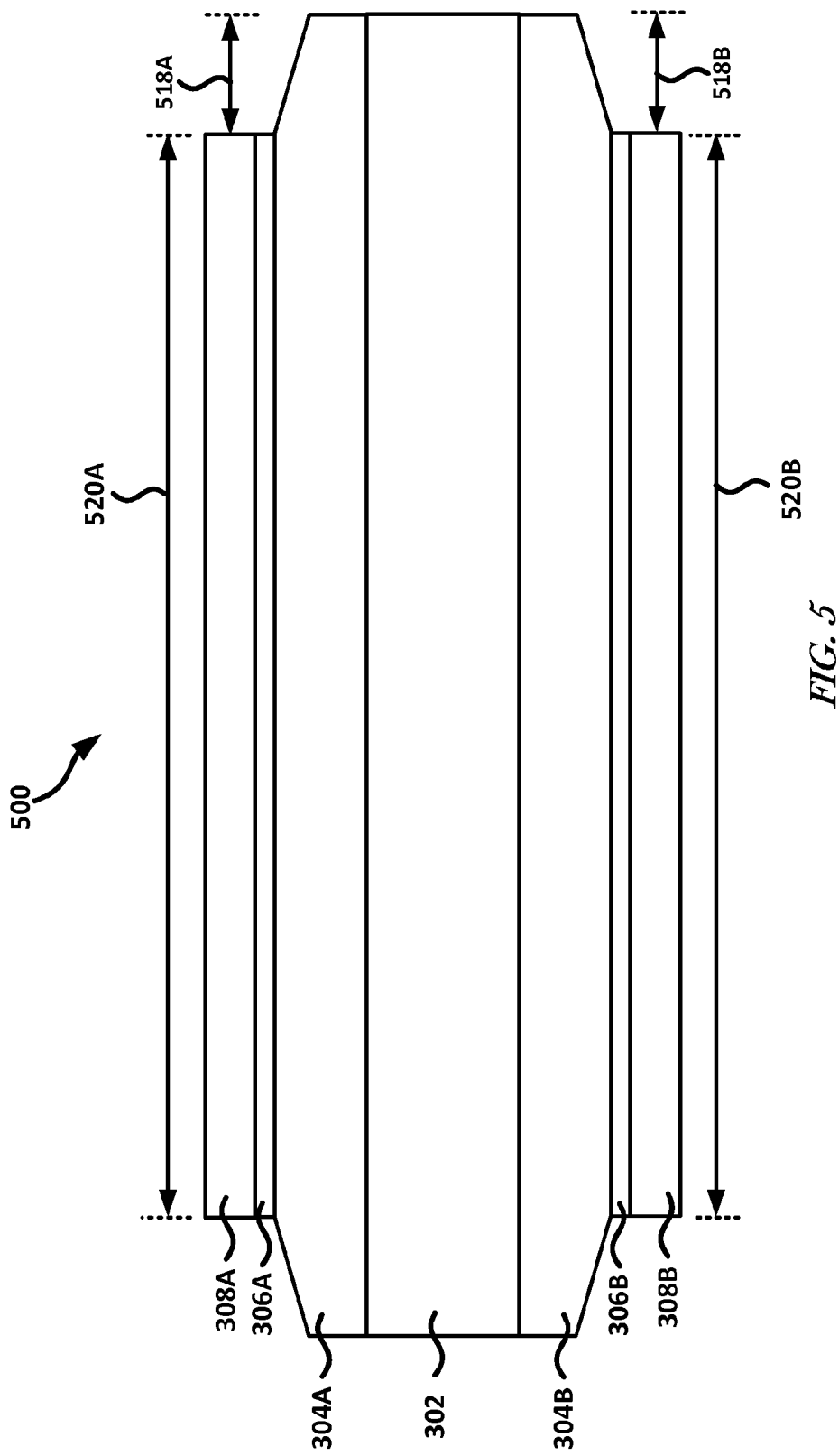
FIG. 5 shows the example panel of FIG. 4 with some material removed from the panel.
Figure 7:
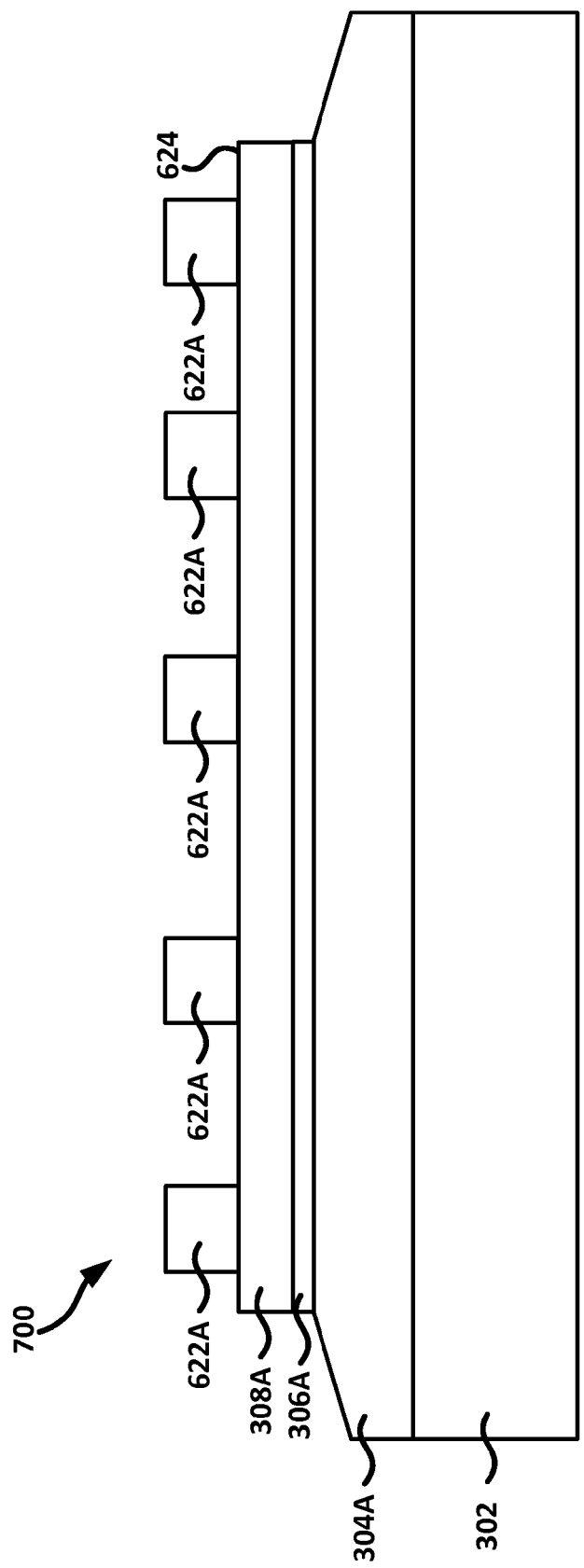
FIG. 7 shows an example of a one-sided panel.

FIG. 5 shows a core panel 500 after the mask 414A-B has been applied and a removal process, such as an etch process, has been performed with the mask 414A-B on the core panel (see the description of FIG. 7 for an explanation of techniques for arranging a mask 414A-B on the core panel or outer conductive foil 308A-B, removing a portion of the outer conductive foil 308A-B, and removing the mask 414A-B).

The core panel 300 can undergo a material removing process, such as to produce the core panel 500 shown in FIG. 5. The material removing process can expose the inner foil 304A-B, at least partially remove the mask 414A-B, or remove a portion of the outer conductive foil 304A-B, adhesive layer 306A-B, or outer conductive foil 308A-B. The material removal process can cause a width 518A or 518B, to be unsuitable for building a substrate thereon (i.e. the width 518A-B can be considered an inactive region of the panel 500 and the width 520A-B can be considered an active region of the panel 500). Other portions of the core panel 500 can be unsuitable for building a substrate thereon, such as locations where the outer conductive foil 308A-B has been removed, such as by the material removal process. The width 520A or 520B can be the area of the core panel 500 that is suitable for building a substrate thereon (i.e. the active area of the panel 500). The substrate can be built on the active area of the outer conductive foil 308A-B.

The material removal process can move the edges of the outer conductive foil 308A-B inward by the size of the width 518A-B. The size of the width 518A-B can be substantially large enough so as to allow equipment used in manufacturing a substrate on the panel 500 to handle the panel 500 and not damage or contact the outer conductive foil 308A-B. In one or more embodiments, the size of the width 518A-B can be between about one millimeter and one centimeter. In one or more embodiments, the size of the width 518A-B can be between about five and fifteen millimeters. In one or more embodiments, the size of the width 518A-B can be between about ten and fifteen millimeters.

A peel strength of an adhesive layer 306A-B in an embodiment that includes an outer conductive foil 308A-B that is about five micrometers thick, such as at thickness 312A-B, and an inner foil 304A-B that is about eighteen micrometers thick, such as at thickness 310A-B, can be between about five Newtons per meter (N/m) and about one hundred N/m. Without the width 518A-B of outer conductive foil 308A-B removed, the manufacturing equipment can prematurely release the outer conductive foil 308A-B (e.g., with or without the adhesive layer 306A-B) from the inner foil 304A-B. With the width 518A-B of outer conductive foil 308A-B removed, the manufacturing equipment can contact the core panel at the exposed portion of the inner foil 304A-B, such as to reduce a risk that the outer conductive foil 308A-B will be released from the inner foil 304A-B.

Figure 6:
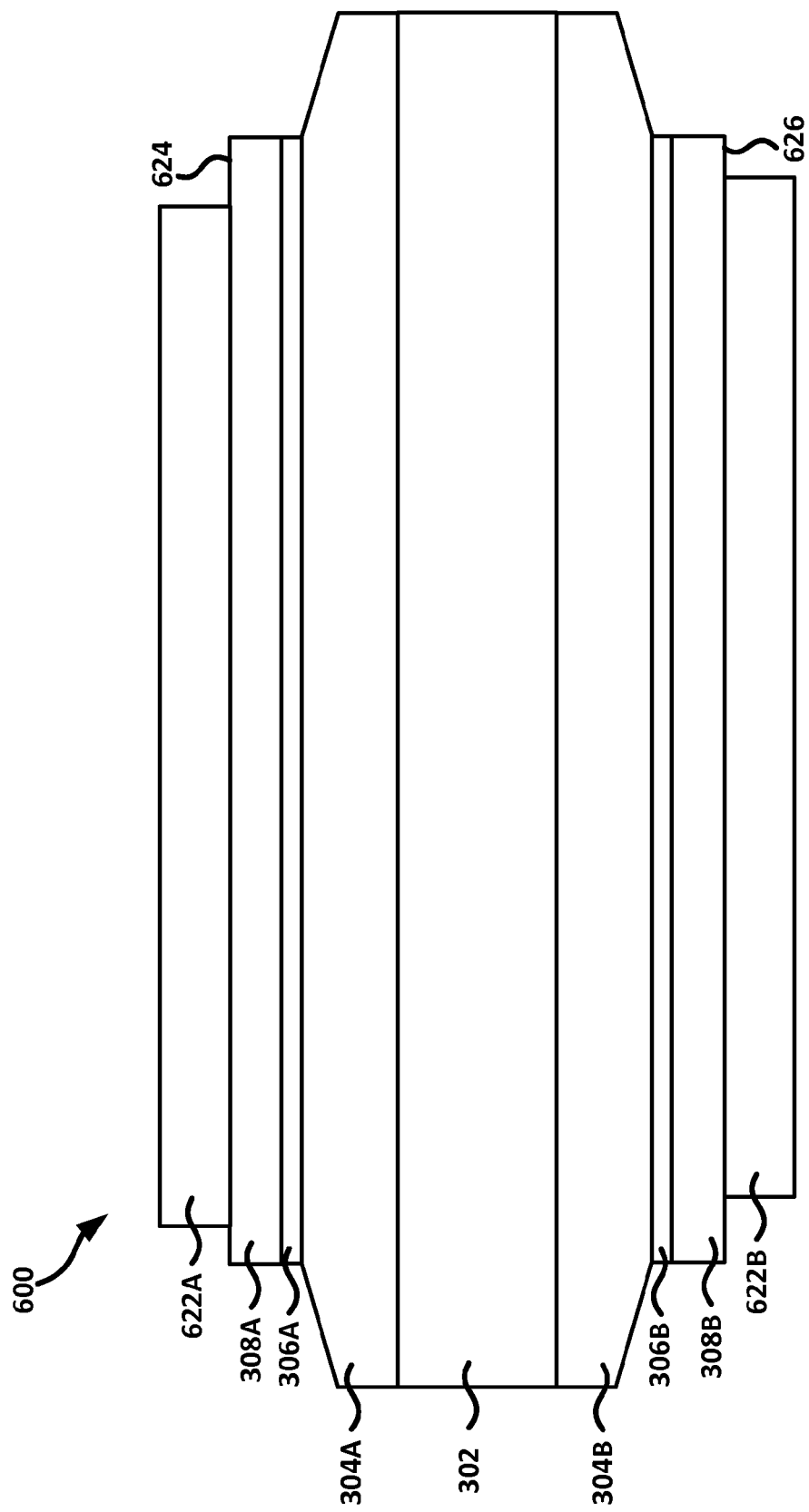
FIG. 6 shows the example panel of FIG. 5 with a substrate built on the panel.

FIG. 6 shows a core panel 600 with a die substrate 622A or 622B situated on a top surface 624 or a bottom surface 626 of the core panel 600, respectively. Note that while one die is shown in the FIG. 6, multiple dies can be situated on the top surface 624 or the bottom surface 626 of the core panel 600. The substrate 622A-B can be formed on the outer conductive foil 308A-B, respectively. The substrate 622A-B can be a Bumpless BuildUp Layer (BBUL) substrate, a Flip Chip substrate, a Surface Mount (SMT) substrate, or other type of substrate.

The die substrate 622A-B can be a cored die substrate, coreless die substrate, or a Bumpless Buildup Layer (BBUL) die substrate. A coreless die substrate can include a substrate that is built up and a die is attached to the die substrate after the die substrate is built. A cored die substrate can include a substrate that includes a die arranged in the substrate and at least a portion of the substrate is built around the die. A BBUL die substrate can include a substrate that includes a die with one or more buildup layers built above the die to form the die substrate.

The die substrate 622A-B built on the outer conductive foil 308A-B can be released from (e.g., pulled off of or otherwise removed from) the panel 600, such as at the adhesive layer 306A-B. The outer conductive foil 308A-B can be separated from the core panel 600. Since the adhesive layer 306A-B and the outer conductive foil 308A-B typically come in panels, the adhesive layer 306A-B generally cannot be reapplied to the inner foil 304A-B. This is because the inner foil 304A-B has diminished in surface area, such as at or near the width 518A-B, so as to prohibit the application of an adhesive layer 306A-B panel to the inner foil 304A-B- panel. Thus, the base 302 and the inner foil 304A-B are typically discarded after the substrate 622A-B is removed from the panel 600 and a new panel is brought in for processing.

FIG. 7 shows an example of a one-sided panel 700. The one-sided panel 700 can be substantially similar to the panel 600, with one or more dies 622A situated on only one side of the core panel 302. The panel 700 can include an inner foil 304A coupled to a side of a base 302 at a side of the first inner foil 304A such that the first inner foil is substantially flush with the base 302. The panel 700 can include a first adhesive layer 306A situated on another side of the first inner foil 304A. The base 302 and the adhesive layer 306A can be situated on opposite sides of the inner foil 304A. An outer conductive foil 308A can be releasably coupled to the inner foil 304A, such as by coupling the outer conductive foil 308A to the adhesive layer.
306A. The panel 700 can be processed as described with regard to other panels discussed herein.

Figure 8:
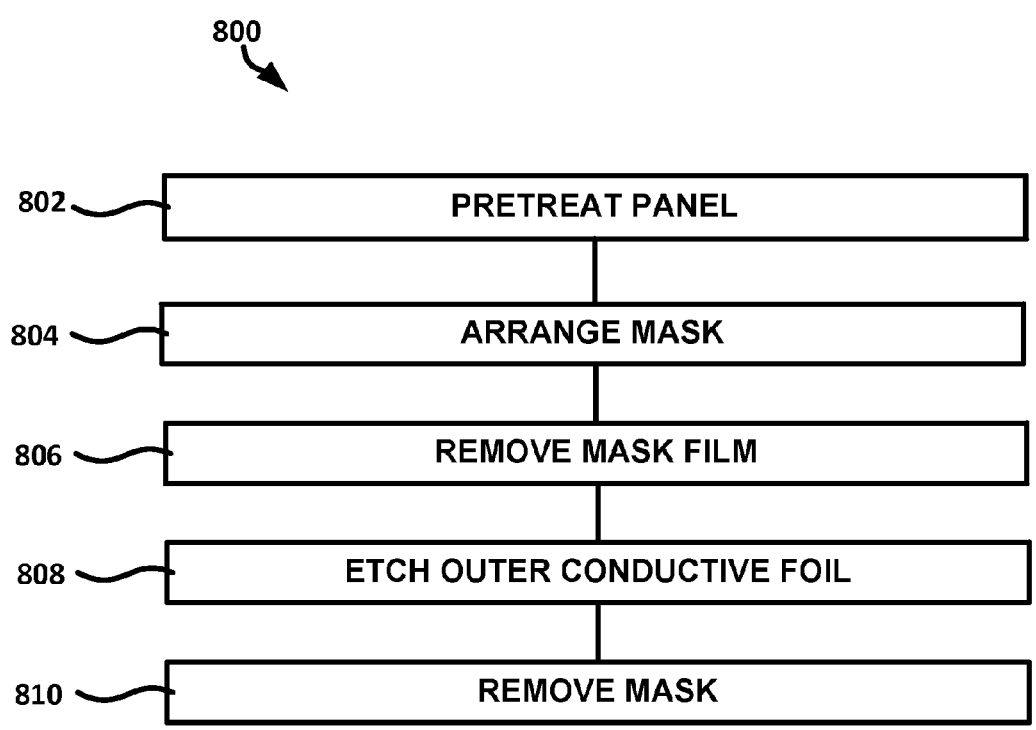
FIG. 8 shows an example of a technique 700 for arranging a mask on a core panel, removing portions of edges an outer conductive foil, and removing the mask.

FIG. 8 shows an example of a technique for arranging the mask 414A-B on the core panel 300, removing a portion the core panel 300 with the mask 414A-B arranged thereon, and removing the mask 414A-B, such as to form the core panel 500. At 802, the core panel 300 can be pretreated, such as to remove a contaminant present on the outer conductive foil 308A-B. The pretreatment can include an acid pretreatment. At 804, the mask 414A-B can be arranged on the core panel 300. In an embodiment where the mask 414A-B includes DFR, a UV adhesive (e.g., tape), or solder resist, arranging the mask 414A-B on the core panel 300 can include laminating the mask 414A-B on the outer conductive foil 308A-B. The technique 800 can include curing the mask 414A-B, such as by exposing the mask 414A-B to UV light. Exposing the mask 414A-B can include a lithography exposure. Exposing the mask 414A-B can include exposing the mask 414A-B to cure the mask 414A-B, such as when the mask 414A-B includes DFR, such as to prepare the mask 414A-B for etching since uncured DFR may not be stable in an etch process At 806, when the mask 414A-B includes a mask film, such as a DFR mask with a polyethylene terephthalate (PET) mask film or a UV adhesive mask with a PET mask film, the mask film can be removed. At 808, a portion of the panel 300 can be removed, such as by etching. A portion of the outer conductive foil 308A-B can be removed, such as by copper etching.

At 810, the mask 414A-B can be removed, such as to create the panel 500. Removing the mask 414A-B can include chemically removing DFR using a DFR stripping process, exposing UV adhesive to UV light, or developing solder resist. Note that the technique 800 does not need to be performed in the order shown in FIG. 8. For example, the mask film can be removed after the panel 300 or the outer conductive foil 308A-B is exposed or etched. The technique 800 can include developing the mask 414A-B, such as when the mask 414A-B includes solder resist, such as to remove the solder resist.

In an embodiment where the mask 414A-B is a UV adhesive, the mask 414A-B removal process can be a dry process.

Figure 9:
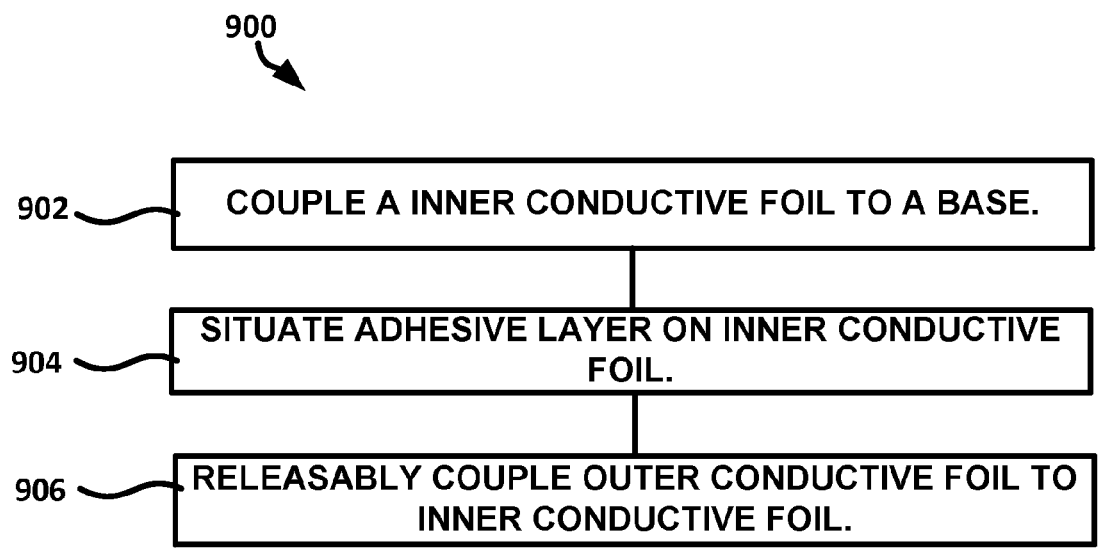
FIG. 9 shows an example of a technique for making a core panel.

FIG. 9 shows an example of a technique 900 for making a panel, such as a panel discussed herein. At 902, a first inner foil 304A can be coupled to a first side of a base 302. The first inner foil 304A can be coupled at a first side of the first inner foil 304A such that the first inner foil 304A is substantially flush with the base 302. At 904, a first adhesive layer 306A can be situated on the first inner foil 304A. The first adhesive layer 306A can be situated on a second side of the first inner foil 304A, the second opposite the first side of the inner foil 304A. At 906, a first outer conductive foil 308A can be releasably coupled to the first inner foil 306A. The first inner foil 304A can be releasably coupled to the outer conductive foil 308A by coupling the first outer conductive foil 308A to the first adhesive layer 306A. Releasably coupling the first outer conductive foil 308A can include releasably coupling such that the first outer conductive foil 308A is substantially flush with the first inner foil 304A.

The technique 900 can include coupling a second inner foil 304B to a second side of the base 302. The second inner foil 304B can be coupled to the base 302 at a first side of the second inner foil 304B. The second inner foil 304B can be coupled such that the second inner foil 304B is substantially flush with the base 302, the second side of the base 302 opposite the first side of the base 302. The technique 900 can include situating a second adhesive layer 306B on a second side of the second inner foil 304B. The second side of the second inner foil 304B can be opposite the first side of the second inner foil 304B. The technique 800 can include coupling a second outer conductive foil 308B to the second inner foil 304B, such as by coupling the second outer conductive foil 308B to the second adhesive layer 306B.

The technique 900 can include situating a first mask 414A on the first outer conductive foil 308A. The technique 900 can include situating a second mask 414B on the second outer conductive foil 308B. The technique 900 can include removing a portion of the first outer conductive foil 308A or the second outer conductive foil 308B, such as by etching the first or second outer conductive foil 308A-B. The technique 900 can include removing the first mask 414A or the second mask 414B.

Figure 10:
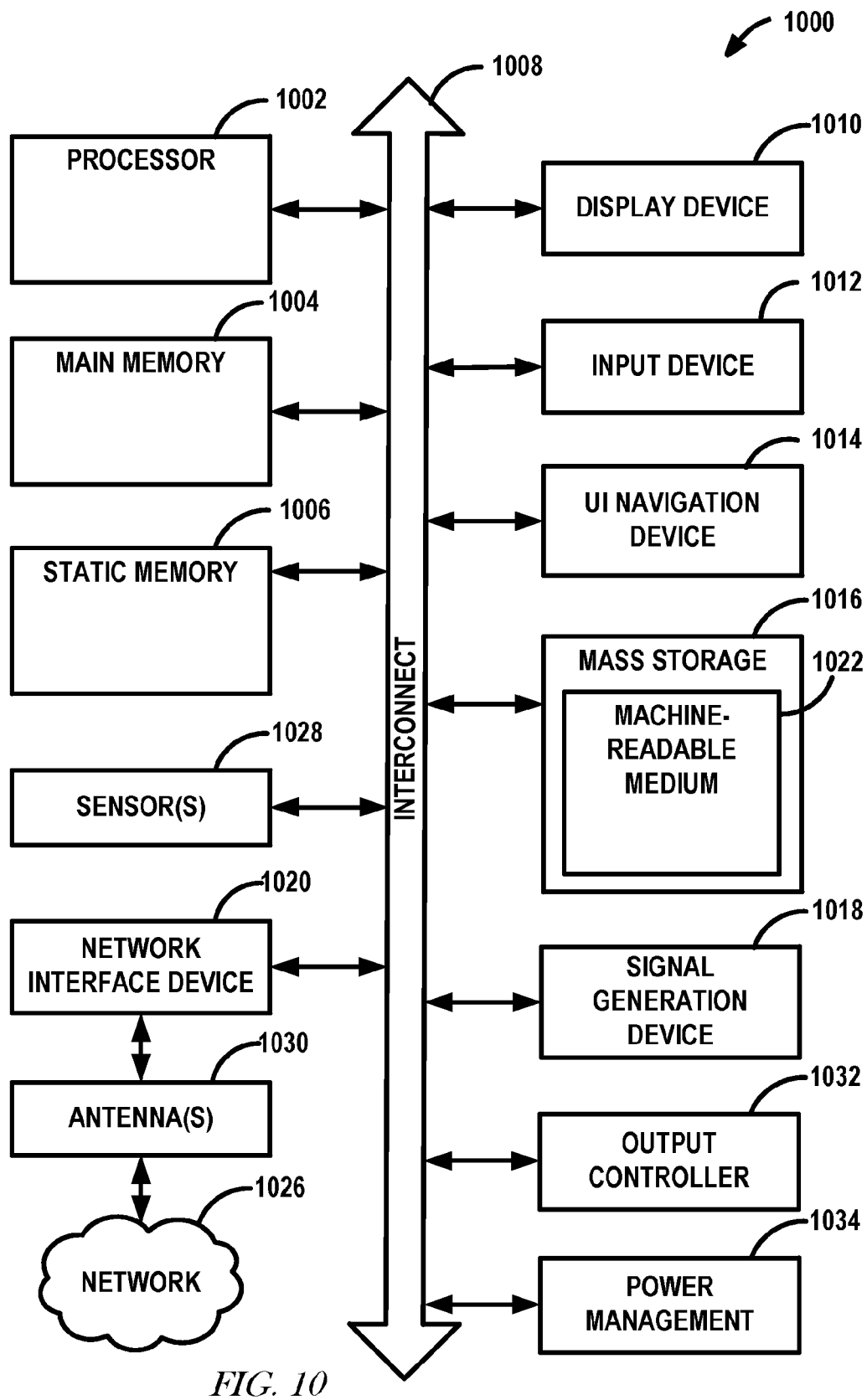
FIG. 10 shows an example of a computer system.

FIG. 10 is a block diagram illustrating an example computer system 1000 machine which can include a panel discussed herein. Computer system 1000 can be a computing device. In an example, the machine can operate as a standalone device or can be connected (e.g., via a cellular network) to other machines. In a networked deployment, the machine can operate in the capacity of either a server or a client machine in server-client network environments, or it can act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 1000 can include a processor 1002 (e.g., a Central Processing Unit (CPU), a Graphics Processing Unit (GPU) or both), a main memory 1004 and a static memory 1006, which communicate with each other via an interconnect 1008 (e.g., a link, a bus, etc.). The computer system 1000 can further include a video display unit 1010, an alphanumeric input device 1012 (e.g., a keyboard), and a User Interface (UI) navigation device 1014 (e.g., a mouse). In an example, the video display unit 1010, input device 1012 and UI navigation device 1014 are a touch screen display. The computer system 1000 can additionally include a storage device 1016 (e.g., a drive unit), a signal generation device 1018 (e.g., a speaker), an output controller 1032, a power management controller 1034, and a network interface device 1020 (which can include or operably communicate with one or more antennas 1030, transceivers, or other wireless communications hardware), and one or more sensors 1028, such as a GPS sensor, compass, location sensor, accelerometer, or other sensor. The antennas 1030 can be coupled to a network 1026.

EXAMPLES AND NOTES

The present subject matter may be described by way of several examples.

Example 1 can include or use subject matter (such as an apparatus, a method, a means for performing acts, or a device readable memory including instructions that, when performed by the device, can cause the device to perform acts), such as can include or use arranging a mask on a center portion of the panel, the panel including a center stiffener with a first foil attached to a first side of the center stiffener by a first adhesive layer and a second foil attached to a second side of the center stiffener by a second adhesive layer, the first side of the center stiffener opposite the second side of the center stiffener, removing portions of exposed edges of the panel, and removing the mask.

Example 2 can include or use, or can optionally be combined with the subject matter of Example 1, to include or use building a first package substrate on the first foil and a second package substrate on the second foil.

Example 3 can include or use, or can optionally be combined with the subject matter of at least one of Examples 1-2, to include or use wherein the first foil includes a first inner foil and a first outer conductive foil releasably coupled by the first adhesive layer, and the second foil includes a second inner foil and a second outer conductive foil releasably coupled by the second adhesive layer.

Example 4 can include or use, or can optionally be combined with the subject matter of at least one of Examples 1-3, to include or use wherein removing portions of exposed edges of the panel includes removing between about ten and about fifteen millimeters of the first and second outer conductive foils using a copper etch process.

Example 5 can include or use, or can optionally be combined with the subject matter of at least one of Examples 1-4, to include or use wherein removing portions of exposed edges of the panel includes removing a portion of the first and second inner foils so as to form a tapered edge on the first and second inner foils.

Example 6 can include or use, or can optionally be combined with the subject matter of at least one of Examples 1-5, to include or use wherein the mask includes an Ultra Violet (UV) adhesive, arranging the mask on the center portion of the panel includes laminating the mask onto the outer conductive foil, removing portions of exposed edges of the panel includes copper etching the outer conductive foil, and removing the mask includes exposing the mask to UV light.

Example 7 can include or use, or can optionally be combined with the subject matter of at least one of Examples 1-5, to include or use removing a mask film on the mask.

Example 8 can include or use, or can optionally be combined with the subject matter of at least one of Examples 1-5 or 7, to include or use wherein the mask film includes Polyethylene Terephthalate (PET).

Example 9 can include or use, or can optionally be combined with the subject matter of at least one of Examples 1-5 or 7-8, to include or use wherein the mask includes a solder resist, arranging the mask on the center portion of the panel includes laminating the mask on the outer conductive foil, removing portions of exposed edges of the panel includes copper etching the outer conductive foil, and removing the mask includes solder resist developing the mask.

Example 10 can include or use, or can optionally be combined with the subject matter of at least one of Examples 1-5 or 7-8, to include or use curing the mask after the mask is arranged on the center portion of the panel, or wherein the mask includes a Dry Film Resist (DFR).

Example 11 can include or use, or can optionally be combined with the subject matter of at least one of Examples 1-10 to include or use pretreating the core panel to remove a contaminant and prime the outer conductive foil and allow the mask to be arranged thereon.

Example 12 can include or use, or can optionally be combined with the subject matter of at least one of Examples 10 or 11, to include or use wherein arranging the mask includes laminating the mask, curing the mask includes lithographically exposing the mask, removing portions of exposed edges of the panel includes etching the first and second outer conductive foil, and removing the mask includes chemically removing the mask.

Example 13 can include or use subject matter (such as an apparatus, a method, a means for performing acts, or a device readable memory including instructions that, when performed by the device, can cause the device to perform acts), such as can include or use a substantially rectangular base, first and second inner foils mechanically coupled to the base, the first inner foil coupled to the base at a first side of the base and the second inner foil coupled to the base at a second side of the base, the second side of the base opposite the first side of the base, first and second adhesive layers situated on the first and second inner foils respectively, or first and second outer conductive foils situated on the first and second adhesive layers, respectively, wherein the first and second inner foils each include a periphery that is substantially flush with a periphery of the base.

Example 14 can include or use, or can optionally be combined with the subject matter of Example 13, to include or use wherein the first and second outer conductive foils each include a periphery that is substantially flush with a periphery of the first and second inner foils, respectively.

Example 15 can include or use, or can optionally be combined with the subject matter of at least one of Examples 13-14, to include or use wherein the first and second outer conductive foils include a width that is smaller than a width of the first and second inner foils, respectively.

Example 16 can include or use, or can optionally be combined with the subject matter of at least one of Examples 13-15, to include or use wherein the first and second outer conductive foils include a thickness that is less than a thickness of the first and second inner foils, respectively.

Example 17 can include or use, or can optionally be combined with the subject matter of Example 16, to include or use wherein the thickness of the first and second outer conductive foils is between about three and six micrometers.

Example 18 can include or use, or can optionally be combined with the subject matter of at least one of Examples 16-17, to include or use wherein the thickness of the first and second outer conductive foils is about five micrometers.

Example 19 can include or use, or can optionally be combined with the subject matter of at least one of Examples 13-18, to include or use wherein the thickness of the first and second inner foils is between about fifteen and twenty micrometers.

Example 20 can include or use, or can optionally be combined with the subject matter of Example 19, to include or use wherein the thickness of the first and second inner foils is about eighteen micrometers.

Example 21 can include or use, or can optionally be combined with the subject matter of at least one of Examples 13-20, to include or use wherein the base includes a carbon impregnated with an epoxy or a resin.

Example 22 can include or use, or can optionally be combined with the subject matter of at least one of Examples 13-21, to include or use wherein the first and second inner foils include copper, and the first and second outer conductive foils include copper.

Example 23 can include or use, or can optionally be combined with the subject matter of at least one of Examples 13-22, to include or use first and second substrates situated on the first and second outer conductive foils, respectively.

Example 24 can include or use, or can optionally be combined with the subject matter of Example 23, to include or use wherein the first substrate is a coreless substrate, cored substrate, or a Bumpless Buildup Layer (BBUL) substrate.

Example 25 can include or use subject matter (such as an apparatus, a method, a means for performing acts, or a device readable memory including instructions that, when performed by the device, can cause the device to perform acts), such as can include or use coupling a first inner foil to a first side of a base at a first side of the first inner foil such that the first inner foil is substantially flush with the base, situating a first adhesive layer on a second side of the first inner foil, the second side of the first inner foil opposite the first side of the inner foil, or releasably coupling a first outer conductive foil to the first inner foil by coupling the first outer conductive foil to the first adhesive layer.

Example 26 can include or use, or can optionally be combined with the subject matter of Example 25, to include or use wherein coupling the first outer conductive foil to the first inner foil includes coupling the first outer conductive foil to the first inner foil such that the first outer conductive foil is substantially flush with the first inner foil.

Example 27 can include or use, or can optionally be combined with the subject matter of at least one of Examples 25-26, to include or use coupling a second inner foil to a second side of the base at a first side of the second inner foil such that the second inner foil is substantially flush with the base, the second side of the base opposite the first side of the base, situating a second adhesive layer on a second side of the second inner foil, the second side of the second inner foil opposite the first side of the second inner foil, or coupling a second outer conductive foil to the second inner foil by coupling the second outer conductive foil to the second adhesive layer.

Example 28 can include or use, or can optionally be combined with the subject matter of Example 27, to include or use situating a first mask on the first outer conductive foil, or situating a second mask on the second outer conductive foil.

Example 29 can include or use, or can optionally be combined with the subject matter of Example 28, to include or use etching the first and second outer conductive foils, or removing the first and second masks.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A panel comprising:
   a substantially rectangular base,
   first and second inner foils adhesively coupled to the base, the first inner foil coupled to the base at a first side of the base and the second inner foil coupled to the base at a second side of the base, the second side of the base opposite the first side of the base;
   first and second adhesive layers situated on the first and second inner foils respectively; and
   first and second outer conductive foils situated on the first and second adhesive layers, respectively,
   wherein the first and second inner foils each include a periphery that is substantially flush with a periphery of the base.

2. The panel of claim 1, wherein the first and second outer conductive foils each include a periphery that is substantially flush with a periphery of the first and second inner foils, respectively.

3. The panel of claim 1, wherein the first and second outer conductive foils include a width that is smaller than a width of the first and second inner foils, respectively.

4. The panel of claim 1, wherein the first and second outer conductive foils include a thickness that is less than a thickness of the first and second inner foils, respectively.

5. The panel of claim 4, wherein the thickness of the first and second outer conductive foils is between about three and six micrometers.

6. The panel of claim 4, wherein the thickness of the first and second inner foils is between about fifteen and twenty micrometers.

7. The panel of claim 1, wherein the base includes a carbon impregnated with an epoxy or a resin.

8. The panel of claim 1, wherein the first and second inner foils include copper, and the first and second outer conductive foils include copper.

9. The panel of claim 1, further comprising:
   first and second substrates situated on the first and second outer conductive foils, respectively.

* * * * *